(12) United States Patent
Shannon et al.

(10) Patent No.: US 7,620,511 B2
(45) Date of Patent: *Nov. 17, 2009

(54) METHOD FOR DETERMINING PLASMA CHARACTERISTICS

(75) Inventors: Steven C. Shannon, San Mateo, CA (US); Daniel J. Hoffman, Saratoga, CA (US); Jeremiah T. P. Pender, San Jose, CA (US); Tarreg Mawari, Manassas, VA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

This patent is subject to a terminal disclaimer.

(21) Appl. No.: 11/758,299

(22) Filed: Jun. 5, 2007

(65) Prior Publication Data

US 2007/0289359 A1 Dec. 20, 2007

Related U.S. Application Data

(63) Continuation of application No. 11/424,705, filed on Jun. 16, 2006, now Pat. No. 7,286,948.

(51) Int. Cl.
*G01R 23/16* (2006.01)
(52) U.S. Cl. .................... 702/76; 702/118; 156/345.24; 216/61; 216/59; 700/108; 700/110; 700/121; 438/8; 438/9; 118/712; 118/723 E; 118/723 FE; 361/234
(58) Field of Classification Search .................. 702/76, 702/118; 156/345.24, 345.28; 216/61, 59, 216/79; 700/108, 110, 121; 438/7, 9, 10; 118/712, 723 E, 723 FE; 315/111.21; 361/234
See application file for complete search history.

(56) References Cited

U.S. PATENT DOCUMENTS

| | | | | |
|---|---|---|---|---|
| 5,467,013 A | * | 11/1995 | Williams et al. | 324/127 |
| 5,472,561 A | * | 12/1995 | Williams et al. | 438/10 |
| 6,197,116 B1 | * | 3/2001 | Kosugi | 118/712 |
| 6,436,304 B1 | * | 8/2002 | Nogami | 216/79 |
| 6,438,440 B1 | * | 8/2002 | Hayashi | 700/121 |
| 6,665,576 B2 | * | 12/2003 | Hayashi | 700/121 |

(Continued)

OTHER PUBLICATIONS

Office Letter from Korean Patent Office for Korean Application No. 10-2007-55985 dated Apr. 22, 2008.

(Continued)

*Primary Examiner*—Carol S Tsai
(74) *Attorney, Agent, or Firm*—Patterson & Sheridan, LLP

(57) ABSTRACT

Methods for determining characteristics of a plasma are provided. In one embodiment, a method for determining characteristics of a plasma includes obtaining metrics of current and voltage information for first and second waveforms coupled to a plasma at different frequencies, determining at least one characteristic of the plasma using the metrics obtained from each different frequency waveform. In another embodiment, the method includes providing a plasma impedance model of a plasma as a function of frequency, and determining at least one characteristic of a plasma using model. In yet another embodiment, the method includes providing a plasma impedance model of a plasma as a function of frequency, measuring current and voltage for waveforms coupled to the plasma and having at least two different frequencies, and determining ion mass of a plasma from model and the measured current and voltage of the waveforms.

13 Claims, 5 Drawing Sheets

U.S. PATENT DOCUMENTS

| | | | |
|---|---|---|---|
| 6,879,870 B2* | 4/2005 | Shannon et al. | 700/121 |
| 6,902,646 B2* | 6/2005 | Mahoney et al. | 156/345.24 |
| 7,076,318 B2* | 7/2006 | Hayashi | 700/121 |
| 7,105,075 B2* | 9/2006 | Ilic et al. | 156/345.28 |
| 7,169,625 B2* | 1/2007 | Davis et al. | 438/9 |
| 7,339,656 B2 | 3/2008 | Matsumoto et al. | |
| 2002/0114123 A1* | 8/2002 | Nishio et al. | 361/234 |
| 2003/0178140 A1* | 9/2003 | Hanazaki et al. | 156/345.28 |
| 2003/0192475 A1* | 10/2003 | Shannon et al. | 118/715 |
| 2004/0098161 A1* | 5/2004 | Hayashi | 700/121 |
| 2004/0112536 A1* | 6/2004 | Quon | 156/345.28 |
| 2005/0019961 A1* | 1/2005 | Davis et al. | 438/7 |
| 2005/0154482 A1* | 7/2005 | Tomoyasu | 700/108 |
| 2006/0012308 A1* | 1/2006 | Ilic et al. | 315/111.21 |
| 2006/0180570 A1* | 8/2006 | Mahoney | 216/59 |
| 2006/0256499 A1* | 11/2006 | Yang et al. | 361/234 |
| 2007/0029282 A1* | 2/2007 | Hoffman | 216/61 |

OTHER PUBLICATIONS

Shannon, et al., "The Impact of Frequency Mixing on Sheath Properties: Ion Energy Distribution and Vdc/Vrf Interaction", Journal of Applied Physics (2005), Mar. 14, 2005, pp. 103304-1 through 103304-4, American Institute of Physics.

Steinback, Andreas, Implementation of in-situ Measurement Techniques for Plasma Processing, 5th European AEC/APC 2004, Apr. 14, 2004 Dresden, Germany.

* cited by examiner

METHOD FOR DETERMINING PLASMA CHARACTERISTICS

CROSS REFERENCE TO RELATED APPLICATIONS

This application is a continuation of U.S. patent Ser. No. 11/424,705, filed Jun. 16, 2006, now U.S. Pat. No. 7,286,948 which is hereby incorporated by reference in its entirety.

BACKGROUND OF THE INVENTION

1. Field of the Invention

The present invention generally relates to plasma processing technologies and, more specifically, to a method for determining characteristics of a plasma in a plasma processing system.

2. Description of the Related Art

Plasma enhanced semiconductor processing chambers are widely used in the manufacture of integrated devices. The process performance generally depends on the physical, chemical, and electrical properties of the plasma. For example, the uniformity and selectivity of a plasma etching process will be strongly related to the kinetic properties of energetic ions of the plasma at or near the surface of a processing substrate. In an anisotropic etch process, incident ions are made to strike a substrate surface with a narrow angular velocity distribution that is nearly perpendicular to the surface, thereby providing an ability to etch high aspect ratio features into the substrate. An ion velocity distribution that is substantially isotropic, however, may result in undesirable etching effects such as bowing or toeing of profile cavity sidewalls.

Furthermore, the kinetic energy distribution of plasma ions may also influence substrate processing result. Generally, a plasma contains chemically reactive species such as atomic radicals ($Cl^-$), atomic ions ($Cl^+$), molecular ions ($Cl_2^+$), and excited molecular ($Cl_2^*$), that are produced by electron-molecule collusions. Plasma generated during processing may have different concentration and/or ratios of atomic ions ($Cl^+$) with respect to molecular ions ($Cl_2^+$). The dynamics of etching processes having different distribution density and/or mixture of atomic and molecular ions ($Cl^+$, $Cl_2^+$) in the plasma may product different etch results.

Additionally, in plasma etching processes using fluorocarbon gases, released $CF_x$ and/or $CF_xH_y$ from the plasma may redeposit on the sidewall of the etched surface in a process known as sidewall passivation. Sidewall passivation is utilized to control the sidewall profile during etching to enable a predetermined depth to be reached while maintaining a desired sidewall profile. However, as the component and/or ratios of the ions impacting the substrate surface are not controlled and/or known in conventional plasma processes, activated chemical reactions and material sputtered etched from the substrate surface may vary chamber to chamber and even process to process, thereby adversely impacting process control, repeatability and predictability of the etch processes.

We have determined that quantitative information about the properties, distribution and energy of ions in a plasma and other plasma characteristics will enable meaningful indications of the effectiveness of the process and quality of the process results, thereby enhancing process control, repeatability and predictability of the etch processes. We have also determined that the ability to provide plasma characteristics enables corresponding improvements in other plasma processes, such as plasma enhanced chemical vapor deposition, physical vapor deposition, plasma surface treatments, among other plasma processes.

Therefore, there is a need for methods for determining the effective ion energy and other plasma characteristics that can be used for improving plasma processes.

SUMMARY OF THE INVENTION

Methods for determining characteristics of a plasma are provided. In one embodiment, a method for determining characteristics of a plasma includes obtaining metrics of current and voltage information of first and second waveforms coupled to a plasma at different frequencies, determining at least one characteristic of the plasma using the metrics obtained from each different frequency waveform.

In another embodiment, a method for determining characteristics of a plasma includes providing a plasma impedance model of a plasma as a function of frequency, and determining at least one characteristic of a plasma using model.

In yet another embodiment, a method for determining characteristics of a plasma includes providing a plasma impedance model of a plasma as a function of frequency, measuring current and voltage for waveforms coupled to the plasma and having at least two different frequencies, and determining ion mass of a plasma from model and the measured current and voltage of the waveforms.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include methods for determining plasma characteristics using a frequency dependent plasma model. By analyzing the plasma at different frequencies, the model facilitates determination of a plurality of plasma characteristics. Some plasma characteristics that may be determined include ion mass, distribution of species of the ion mass, ions density, plasma asymmetry, electron temperature, sheath potential and collision frequency. It is contemplated that the method may be utilized to determine other plasma characteristics.

The plasma characteristics are determined by model analysis using information obtained from RF waveforms coupled to the plasma. In one embodiment, a first RF waveform used in the model analysis may be used to sustain the plasma discharge. The second RF waveform used in the model analysis may also be used to drive the plasma, be a low power diagnostic waveform coupled to the plasma, or a waveform harmonic of the plasma. The analysis may also be performed with more than two RF waveforms coupled to the plasma obtained from other sources, some of which are further described below.

The model takes advantage of the frequency dependence of a plasma discharge's electrical impedance. The model includes a frequency dependent expression that has plasma characteristics as different variables. In practice, a first variable of the model may be solved in terms of a second variable in a first model expression representing the plasma state at a first frequency, which can then be substituted into second model expression representing the plasma state at a second frequency to solve for the second variable. Once a value for the second variable has been determined, the value for the second variable may then be utilized to determine a value for the first variable.

In the embodiments described herein, the model of the RF waveform analysis is based on expressions for plasma impedance. Current and/or voltage are utilized as inputs for solving the expressions in terms of the plasma characteristics. It is contemplated that other models may be derived to utilize the methods described herein. It is also contemplated that the models may utilize inputs other than, or in addition to, voltage and/or current, such as the phase of the waveform. Although the methods described herein are illustratively presented in terms of an etch application, the methods are equally suitable for use in any plasma processes (i.e., physical vapor deposition, plasma enhanced chemical vapor deposition, plasma ion implantation and plasma film treatment, among others) for characterizing plasma parameters which can be utilized to improve process results, prediction and repeatability.

Figure 1A:
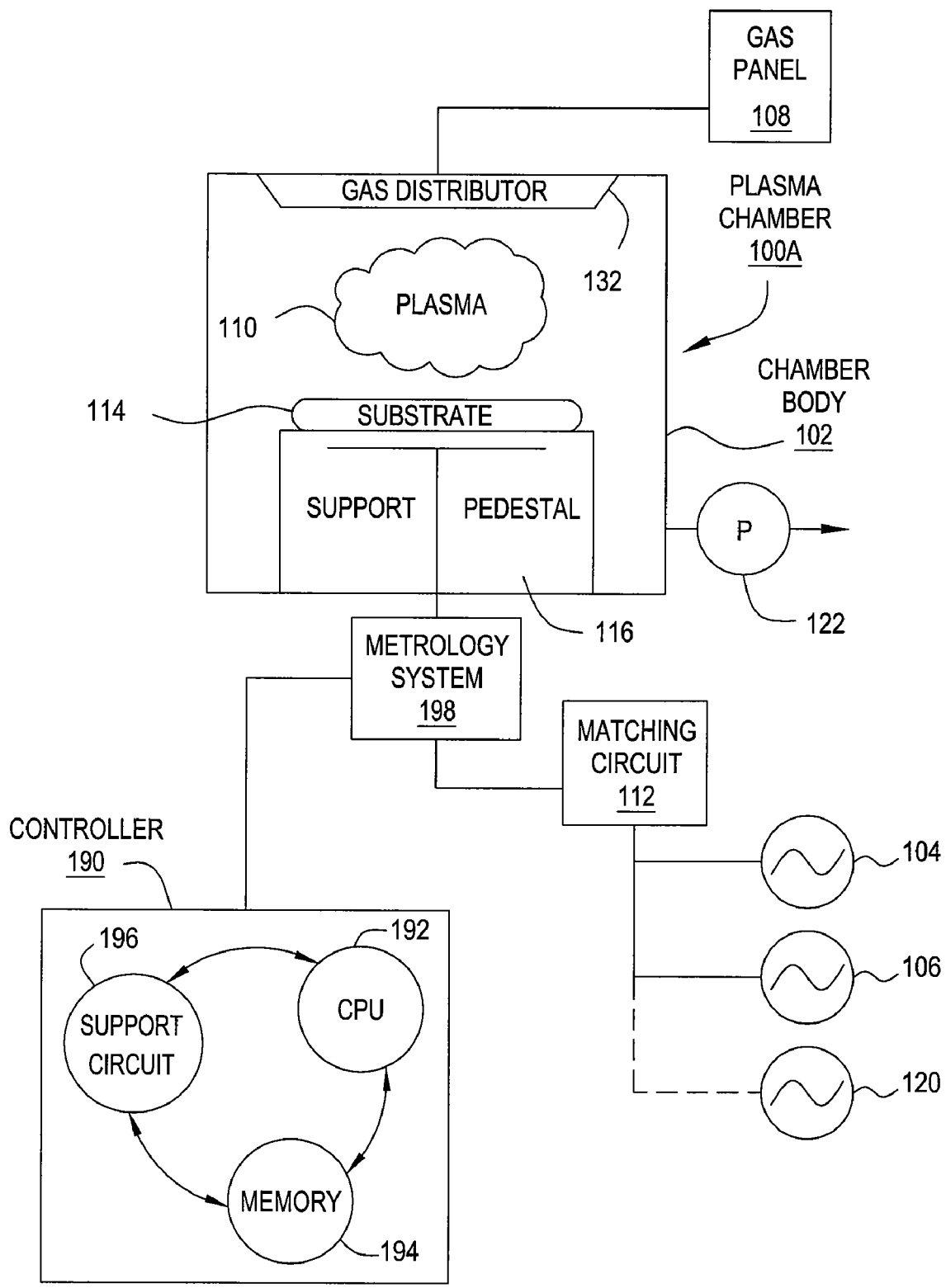
FIGS. 1A-C are schematic diagram of exemplary plasma enhanced processing chambers in which embodiments of the invention may be practiced.
Figure 1B:
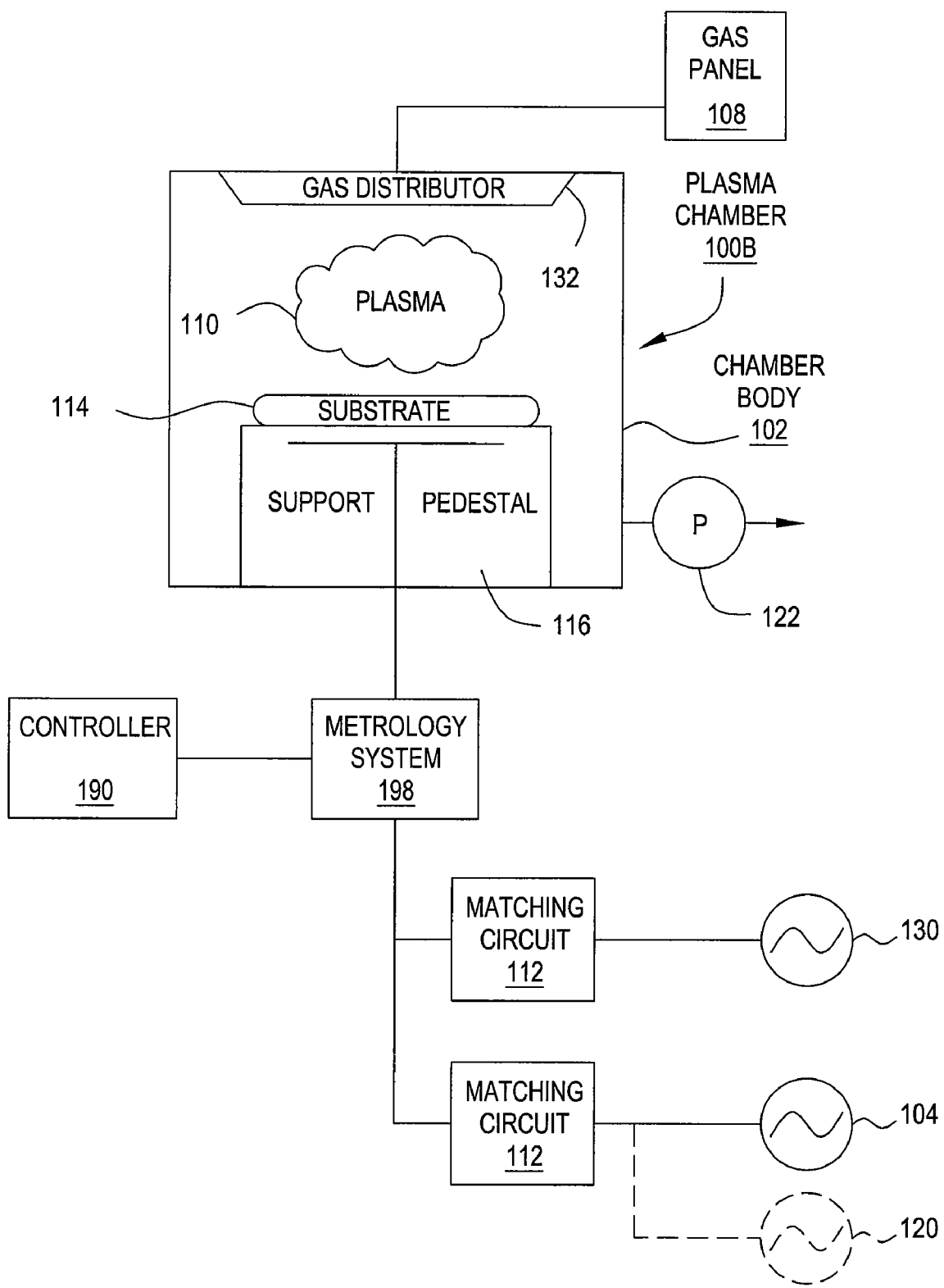
Figure 1C:
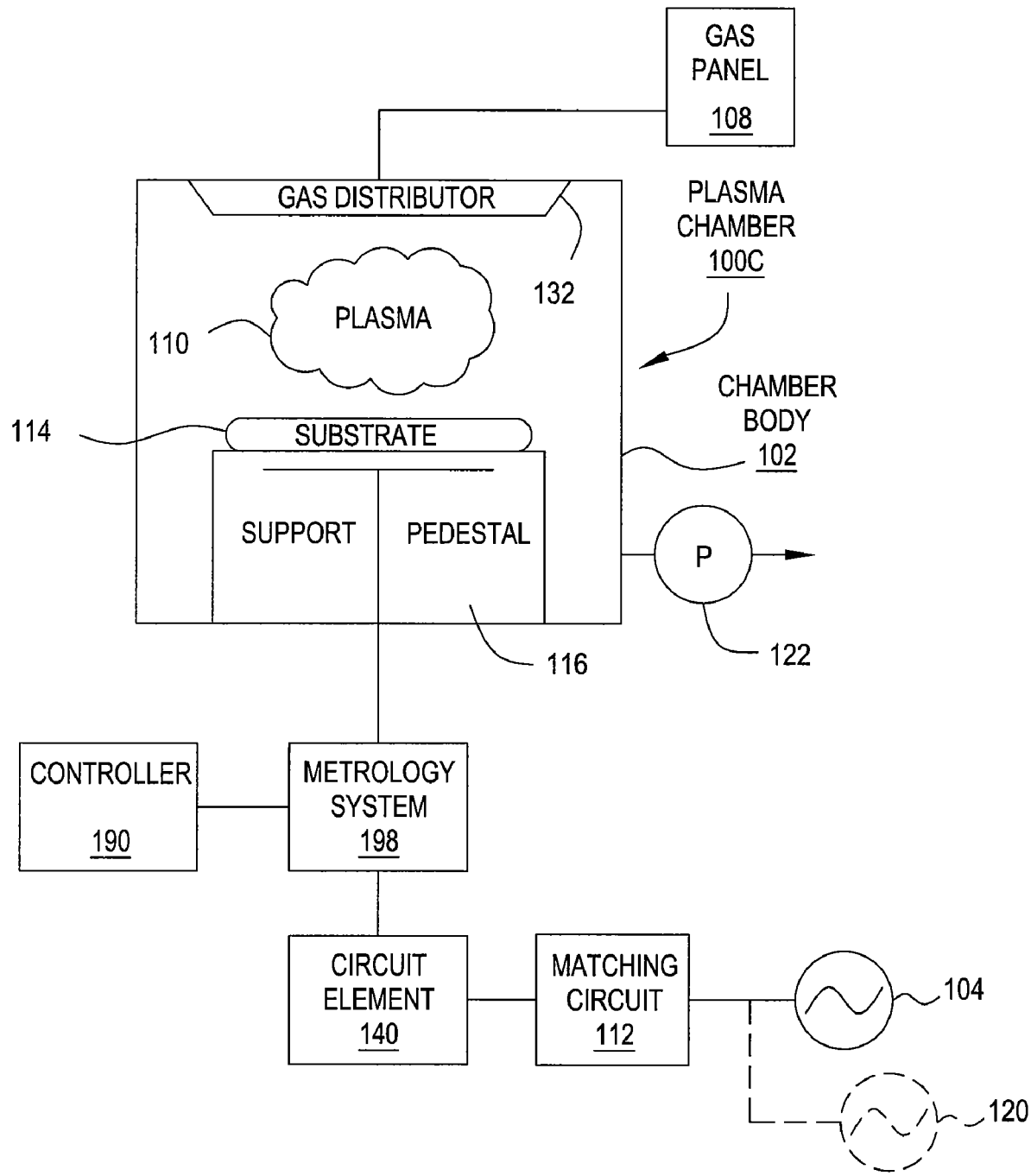

FIGS. 1A-C presents schematic diagrams of plasma processing chambers 100A-C in which the present invention may be performed. Examples of plasma etch chambers that may be adapted to benefit from the present include, but are not limited to, the Decoupled Plasma Source (DPS®, DPS® II), EMAX®, MXP®, and ENABLER® processing chambers, all available from Applied Material, Inc., of Santa Clara, Calif. It is contemplated that other plasma chambers, including those from other manufacturers, may be adapted to practice the invention. Although the plasma processing chambers 100A-C illustratively described below is configured as an etch chamber, the invention may be utilized for other plasma processes as indicated above.

Common to all embodiments is at least one RF metrology system 198 interfaced with the plasma processing chambers 100A-C which is suitable for measuring at least one of voltage, current and phase of an RF waveform coupled to a plasma 110 formed in the chamber from gases provided by a gas panel 108. The metrology system 198 may include one or more sensors. Generally, the metrology system 198 is positioned to interface with the RF waveform between its source (such as an RF power source, or the plasma itself).

Referring now to FIG. 1A, the plasma processing chamber 100A includes a grounded chamber body 102 coupled to the gas panel 108, one or more RF power sources and a controller 190. The gas panel 108 provides process and other gases to the process region defined in the chamber body 102. At least one of the RF power sources is utilized to sustain the plasma 110 formed from the process gases within the process region, typically to promote substrate processing, chamber or component seasoning and/or coating, and/or chamber cleaning.

A substrate support pedestal 116 disposed within the chamber body 102 below a gas distributor 132. The pedestal 116 may include an electrostatic chuck (not shown) for retaining a substrate 114 below the gas distributor 132. The electrostatic chuck is driven by a DC power supply to develop an electrostatic force that holds the substrate 114 to the chuck surface, as is conventionally known. Alternatively, the substrate 114 may be retained to the pedestal by clamping, vacuum or gravity.

In one embodiment, the substrate support pedestal 116 is configured as a cathode and is coupled to a plurality of RF power sources. RF power, provided by at least a first RF power source 104, is coupled between the cathode and another electrode, such as the gas distributor 132 or ceiling of the chamber body 102. The RF power excites and sustains a plasma discharge (e.g., plasma 110) formed from the gases disposed in the processing region of the chamber body 102.

In the embodiment depicted in FIG. 1A, a plurality of RF power sources 104, 106 are coupled to the cathode through a matching circuit 112. Although not as depicted in FIG. 1A, the matching circuit 112 may incorporate or interface with the RF metrology system 198. The signal generated by the RF power sources 104, 106 is delivered through matching circuit 112 to the substrate support pedestal 116 through a single feed forming to ionize the background gas mixture provided in the plasma processing chamber 100A, thereby providing ion energy necessary for performing an etching or other plasma enhanced process. The RF power sources 104, 106 are generally capable of producing an RF signal having a frequency of from about 50 kHz to about 200 MHz and a power between about 0 Watts and about 5000 Watts. Another optional RF source 120 is shown in FIG. 1A and is representative of one or more additional power sources that may be used to control the characteristics of the plasma 110.

The gas distributor 132 may comprise one or more nozzles or a showerhead. The gas distributor 132 is coupled to the gas panel 108 such that gases provided to the gas distributor 132 from the gas panel 108 may introduced into the chamber and, when ignited, formed into the plasma 110 utilized for processing the substrate 114.

In one mode of operation, the substrate 114 is disposed on the substrate support pedestal 116 in the plasma processing chamber 100. A process gas and/or gas mixture is introduced into the chamber body 102 through the gas distributor 132 from the gas panel 108. A vacuum pumping system 122 maintains the pressure inside the chamber body 102 while removing etch by-products. The vacuum pumping system 122 typically maintains an operating pressure between about 10 mTorr to about 20 Torr.

The RF source 104, 106 provides RF power at separate frequencies to the cathode through the matching circuit 112, thereby providing energy to form the plasma 110 and excite the gas mixture in the chamber body 102 into ions to perform a plasma process, in this example, an etching process. The RF metrology system 198 measures metrics of the waveform coupled to the plasma 110 to provide a metric indicative of the power provided by each power source 104, 106. The metric is transmitted to the controller 190 and utilized to determine characteristics of the plasma as further detailed below. The characteristics of the plasma may be analyzed to adjust the process in-situ processing, to correct process drift, to match processes between different chambers, and/or to achieve certain process results.

The controller 190 is coupled to the various components of the plasma processing chamber 100 and is used to facilitate control of an etch process. The controller 190 generally includes a central processing unit (CPU) 192, a memory 194, and support circuits 196 for the CPU 192. The CPU 192 may be one of any form of computer processor that can be used in an industrial setting for controlling various chambers and subprocessors. The memory 194 is coupled to the CPU 192. The memory 194, or computer-readable medium, may be one or more of readily available memory such as random access memory (RAM), read only memory (ROM), floppy disk, hard disk, or any other form of digital storage, local or remote. The support circuits 196 are coupled to the CPU 192 for supporting the processor in a conventional manner. These circuits include cache, power supplies, clock circuits, input/output circuitry and subsystems, and the like.

A process, for example a method 200 for determining plasma characteristics described below, is generally stored in the memory 194, typically as a software routine. The software routine may also be stored and/or executed by a second CPU (not shown) that is remotely located from the hardware being controlled by the CPU 192. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

FIG. 1B depicts another embodiment of a plasma processing chamber 100B in which the present invention may be performed. The plasma processing chamber 100B is substantially similar to the plasma processing chamber 100A described above, and a low power diagnostic power source 130 is coupled to the plasma 110. The processing chamber 100B may utilize a single RF source 104 to sustain the plasma 110, or alternatively other optional RF power sources 120 may be additionally utilized. The metrology system 198 is configured to obtain a metric of at least one of current, voltage and phase from both the low power RF diagnostic power source 130 and the RF power source 104.

The low power RF diagnostic power source 130 is coupled to the plasma at frequency different that of the power provided by the primary or plasma RF source 104. The diagnostic power only serves as a source of additional frequency information for plasma impedance measurement, and does not significantly change the operational characteristics of the plasma discharge. In one embodiment, the diagnostic power form the source 130 is provides between about 10 milliwatts to about 10 Watts to the plasma.

FIG. 1C depicts another embodiment of a plasma processing chamber 100C in which the present invention may be performed. The plasma processing chamber 100C is substantially similar to the plasma processing chambers 100A-B described above, except wherein the metrology system 198 is configured for measuring one or more RF waveforms that are harmonics of the plasma, i.e., the plasma serves as a source of the waveform, as well as waveforms from the RF source 104. The metrology system 198 is generally disposed between a circuit element 140 and the plasma 110. The circuit element 140, such as a low pass filter, is selected to create an open circuit for waveforms having a frequency greater than the fundamental frequency (i.e., the frequency provided by the RF source 104), thereby protecting the RF sources from reflected plasma harmonics.

The plasma 110 formed in the chamber 100C may be sustained by a single RF source 104, or alternatively other optional RF power sources 120 may be additionally utilized. It is contemplated that a low power diagnostic power source 130 (as shown in FIG. 1B, may also be coupled to the chamber 100C.

Figure 2:
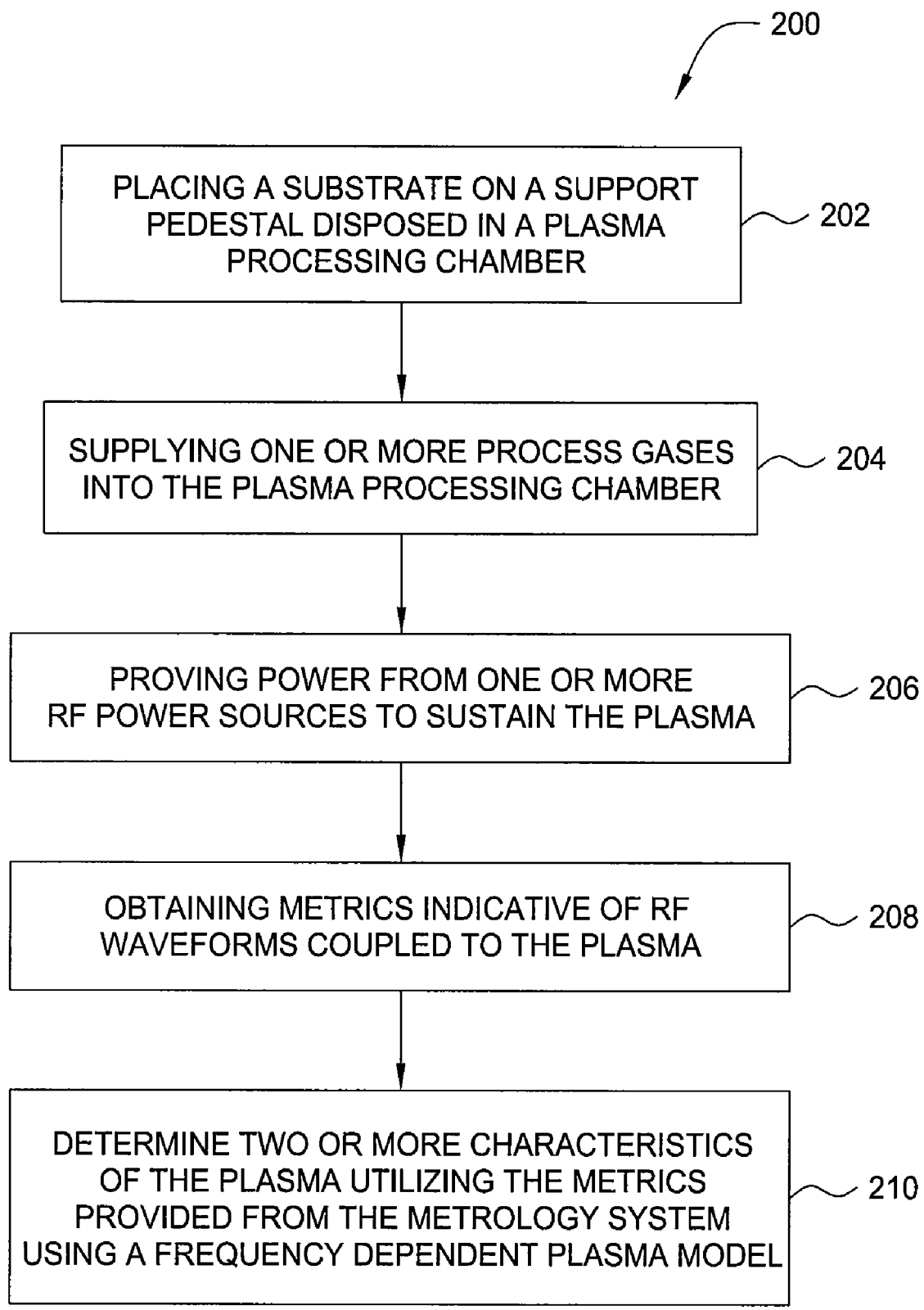
FIG. 2 is a process flow diagram of one embodiment of a method for determining plasma characteristics.

FIG. 2 depicts a process flow diagram of one embodiment of a method 200 for determining characteristics of the plasma 110 that may be performed in the plasma processing chambers 100A-C using information obtained by the RF metrology system 198. For sake of clarity, plasma processing chambers 100A-C will be collectively referred henceforth as "the plasma processing chambers" without further the reference to the numerals 100A-C.

The method 200 begins at step 202 by placing the substrate 114 on the support pedestal 116 disposed in the plasma processing chamber. It is noted that the method 200 may be performed without a substrate within the chamber.

At step 204, one or more process gases are supplied from the gas panel 108 into the plasma processing chamber and are formed into the plasma 110 to provide reactive species (e.g., ions or radicals) used for processing. At step 206, power is provide from one or more RF power sources to sustain the plasma 110.

At step 208, the metrology system 198 obtains metrics indicative of the RF waveforms coupled to the plasma 110. In one embodiment, the RF waveforms are from the RF sources 104, 106 which provide power at different frequencies to sustain the plasma, as shown in FIG. 1A. Some common frequencies pairs include 2 and 13 kHz, 2 and 60 kHz, and 13 and 60 kHz. In embodiments where three RF power sources are used to sustain the plasma, common frequencies groupings include 2, 13 and 60 kHz and 2, 13 and 162 kHz.

In another embodiment, one of the RF waveforms is from a first RF source utilized to provide power sustain the plasma, while another RF waveform is from a second RF source that generates a low power diagnostic power that is coupled to the plasma at different frequency different that the power provided by the first RF source, as shown in FIG. 1B. It is also contemplated that multiple low power diagnostic power sources may be utilized to generate the different waveforms. The diagnostic waveforms may be used alone, or in conjunction with the waveforms obtained from other sources.

In yet another embodiment, one of the RF waveforms is from a first RF source utilized to provide power sustain the plasma, while another RF waveform is a harmonic of the plasma, i.e., the plasma serves as a source of the second frequency waveform which is at a frequency different that the power provided by the first RF source, as shown in FIG. 1C. It is also contemplated that waveforms from more than one harmonic frequency may be utilized. The harmonic waveforms may be used alone, or in conjunction with the waveforms obtained from other sources.

It is contemplated that waveforms forms difference frequencies may be obtained by any combination of the examples given above. For example, one or more RF sustaining waveforms (at one or more frequencies) may be analyzed with waveforms obtained from harmonic and/or diagnostic sources. In another example, one or more harmonic waveforms may be analyzed with waveforms obtained from one or more diagnostic RF sources.

In one embodiment, the metrology system 198 is utilized to obtain current and voltage metrics of RF waveforms measured between the source and plasma. The metrics are provided to the controller 190.

At step 210, the controller 190 determines two or more characteristics of the plasma utilizing the metrics provided form the metrology system 198. In one embodiment, the metrics are utilized by the controller 190 to determine sheath voltage and ion density. The sheath voltage is approximately equal to the amplitude of the RF voltage modulation, while the ion density if approximately equal to the magnitude of the RF current. The sheath voltage and ion density are utilized as input variables for a model that expresses the plasma impedance as a function of frequency.

The model is generally a lump element circuit expression of the plasma using known electrical plasma characteristics. For example, the portion of the expression for sheath impedance may be based on Childs Law, while the portion of the expression for bulk impedance may be based on homogeneous plasma models. It is contemplated that the model may be based on other theories or derived empirically, and resolved to obtain plasma characteristics utilizing the method described herein.

The model generally includes variables for ion mass, collision frequency, electron temperature, plasma asymmetry, sheath voltage and ion density. As values for ion density and sheath voltage are provided as discussed above, the expression of the model may be resolved for any of the remaining variables, e.g., ion mass, collision frequency, electron temperature and plasma asymmetry. If waveform information is available at only two frequencies, two of the four remaining variables may be assigned approximated values so that the other variables of greater interest may be resolved. If waveform information is available at three or more frequencies, all of the four remaining variables may be determined.

Figure 3:
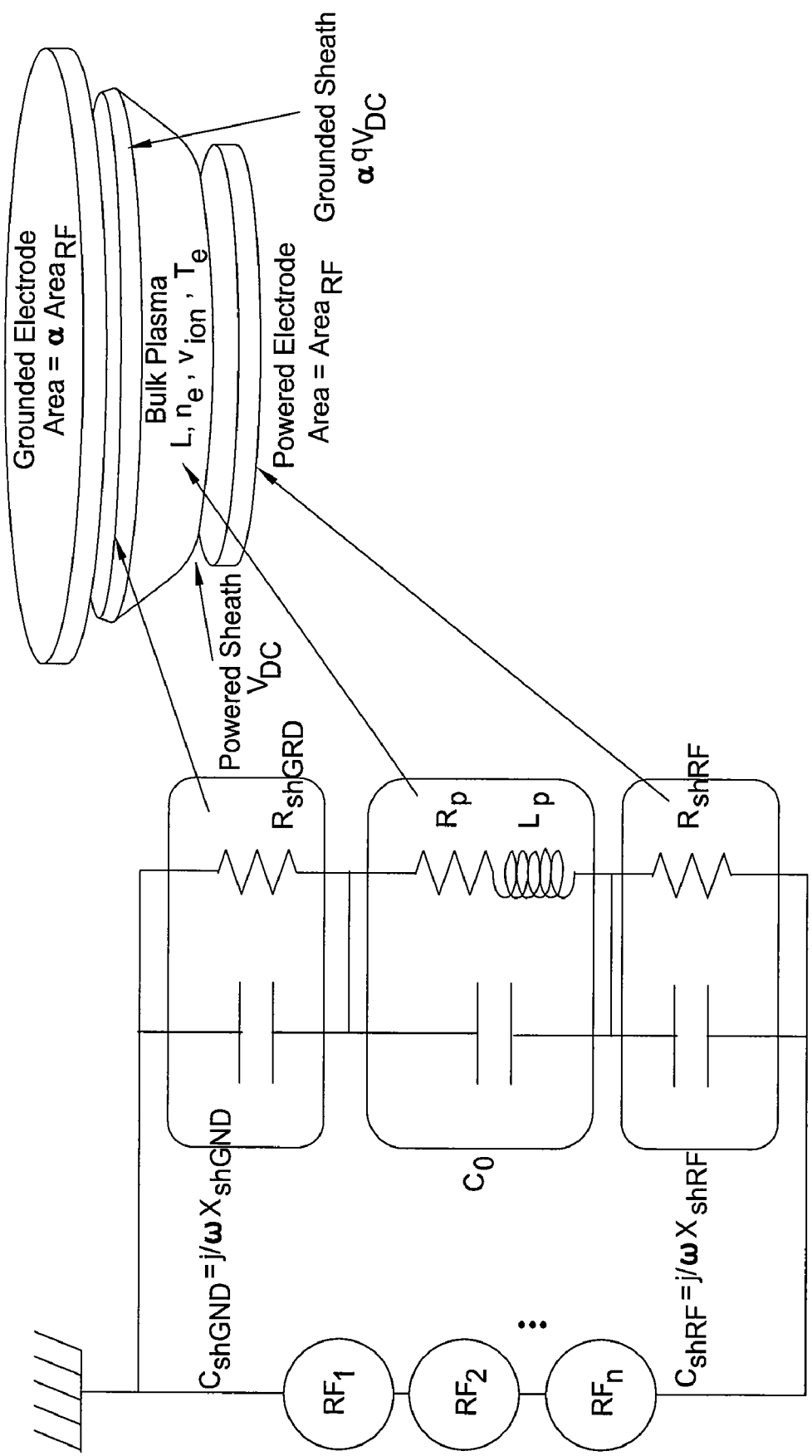
FIG. 3 is a simplified circuit diagram of a plasma model.

The model is utilized by solving for a first variable using a model expression at a first frequency, than substituting the first variable, expressed in terms of the first frequency model expression, into the model expression for the second frequency, wherein a second variable of interest may be resolved. Using the resolve value of the second variable, the valve for the first variable may be resolve. Utilizing this method, any pair of ion mass, collision frequency, electron temperature and plasma asymmetry may be determined using two frequency model analysis, or all may be determined using model analysis at three or more frequencies. It is contemplated that the model may be resolved using other analytical approaches, for example, neural networks, best fit, regression analysis, solving for a unique solution for all equations, among others FIG. 3 is one embodiment of a simplified circuit diagram of a plasma model. The plasma model may assume an asymmetric capacitive discharge (homogeneous, constant ion MFP) using high frequency bulk plasma approximation (see, for example, Godyak V 1986 Soviet RF Discharge Research and Child Law High Voltage Sheath Approximation (C. D. Child, Phys. Rev., 32)). In an illustrative embodiment, an Argon plasma may have center point parameters of $n_e=1010$ cm$^{-3}$, $V_{DC}=500$ Volts, $v_{me}=0.01$/ns, $\alpha=0.5$, and $T_e=5$ eV.

The sheath reactance may be expressed as:

$$J_d = \frac{\omega \cdot \varepsilon_0 \cdot V}{s}$$

$$I_d = \frac{\omega \cdot \varepsilon_0 \cdot V \cdot \text{Area}}{s_0} = \omega \cdot C_{sheath} \cdot V$$

$$C_{sheath} = \frac{\varepsilon_0 \cdot \text{Area}}{s}$$

Sheath thickness can be approximated by $$s = \sqrt[4]{\frac{32 \cdot \varepsilon_0^2 \cdot V_{DC}^3}{81 \cdot .372 \cdot n_e^2 \cdot e \cdot T_e}}$$

-continued $$\frac{1}{s} = \sqrt[4]{\frac{81 \cdot 0.61 \cdot n_e^2 \cdot e \cdot T_e}{32 \cdot \varepsilon_0^2 \cdot V_{DC}^3}}$$

$$C_{sheath} = \frac{\varepsilon_0 \cdot \text{Area}}{s}$$

$$X_{sheath} = \frac{-s}{\omega \cdot \varepsilon_0 \cdot \text{Area}}$$

$$X_{sheath} = \frac{-1}{\omega \cdot \varepsilon_0 \cdot \text{Area}} \cdot \sqrt[4]{\frac{32 \cdot \varepsilon_0^2 \cdot V_{DC}^3}{81 \cdot .372 \cdot n_e^2 \cdot e \cdot T_e}}$$

The sheath resistance may be expressed as:

$$J_i = \frac{2 \cdot \omega_i}{3 \cdot \pi \cdot \omega} \cdot J_d = \frac{2 \cdot \omega_i \cdot \varepsilon_0 \cdot V}{3 \cdot \pi \cdot s}$$

$$J_i = J_e$$

$$J_c = J_i + J_e = 2 \cdot J_i = \frac{4 \cdot \omega_i \cdot \varepsilon_0 \cdot V}{3 \cdot \pi \cdot s}$$

$$R_{sheath} = \frac{V}{J_c \cdot \text{Area}} = \frac{3 \cdot \pi \cdot s}{4 \cdot \omega_i \cdot \varepsilon_0 \cdot \text{Area}}$$

$$\omega_i = \pi \cdot \omega_{pi} \cdot \sqrt[4]{\frac{2 \cdot T_e}{e \cdot V_{DC}}}$$

$$R_{sheath} = \frac{3 \cdot s}{4 \cdot \omega_{pi} \cdot \varepsilon_0 \cdot \text{Area}} \cdot \sqrt[4]{\frac{e \cdot V_{DC}}{2 \cdot T_e}}$$

$$\omega_{pi} = e \sqrt{\frac{n_e}{\varepsilon_0 \cdot M}}$$

$$R_{sheath} = \frac{3 \cdot s}{4 \cdot e \cdot \varepsilon_0 \cdot \text{Area}} \cdot \sqrt[4]{\frac{e \cdot V_{DC} \cdot \varepsilon_0^2 \cdot M^2}{2 \cdot T_e \cdot n_e^2}}$$

$$R_{sheath} = \frac{3 \cdot V_{DC}}{2 \cdot e \cdot n_e \cdot \text{Area}} \cdot \sqrt[4]{\frac{M^2}{T_e^2 \cdot 81 \cdot 0.372}}$$

Treating as parallel elements, starting with the powered sheath, and scaling the grounded sheath due to asymmetry conditions:

$$R_{shRF} = \frac{\frac{2}{9 \cdot \omega^2 \cdot \varepsilon_0 \cdot e \cdot \text{Area} \cdot n_e \cdot T_e} \cdot \sqrt{\frac{2 \cdot V_{DC}^3 \cdot M}{0.61 \cdot e}}}{\frac{4}{9 \cdot \omega^2 \cdot \varepsilon_0} \cdot \sqrt{\frac{2 \cdot V_{DC}}{e \cdot T_e}} + \frac{V_{DC} \cdot M}{4 \cdot e^2 \cdot n_e \cdot T_e}}$$

$$X_{shRF} = \frac{\frac{-V_{DC} \cdot M}{2 \cdot e^2 \cdot n_e \cdot T_e \cdot \omega \cdot \varepsilon_0 \cdot \text{Area}} \cdot \sqrt[4]{\frac{2 \cdot \varepsilon_0^2 \cdot V_{DC}^3}{81 \cdot .372 \cdot n_e^2 \cdot e \cdot T_e}}}{\frac{4}{9 \cdot \omega^2 \cdot \varepsilon_0} \cdot \sqrt{\frac{2 \cdot V_{DC}}{e \cdot T_e}} + \frac{V_{DC} \cdot M}{4 \cdot e^2 \cdot n_e \cdot T_e}}$$

$$\frac{V_{GND}}{V_{RF}} = \left(\frac{\text{Area}}{\text{Area}_{GND}}\right)^q$$

$$\alpha = \frac{\text{Area}}{\text{Area}_{GND}}$$

$$V_{GND} = V_{DC} \alpha^q$$

-continued $$R_{shGND} = \frac{\frac{2}{9 \cdot \omega^2 \cdot \varepsilon_0 \cdot e \cdot \text{Area} \cdot n_e \cdot T_e} \cdot \sqrt{\frac{2 \cdot V_{DC}^3 \cdot \alpha^{3 \cdot q} \cdot M}{0.61 \cdot e}}}{\frac{4}{9 \cdot \omega^2 \cdot \varepsilon_0} \cdot \sqrt{\frac{2 \cdot V_{DC} \cdot \alpha^q}{e \cdot T_e}} + \frac{V_{DC} \cdot \alpha^q \cdot M}{4 \cdot e^2 \cdot n_e \cdot T_e}}$$

$$X_{shGND} = \frac{\frac{-V_{DC} \cdot \alpha^q \cdot M}{2 \cdot e^2 \cdot n_e \cdot T_e \cdot \omega \cdot \varepsilon_0 \cdot \text{Area}} \cdot \sqrt[4]{\frac{2 \cdot \varepsilon_0^2 \cdot V_{DC}^3 \cdot \alpha^{3 \cdot q}}{81 \cdot .372 \cdot n_e^2 \cdot e \cdot T_e}}}{\frac{4}{9 \cdot \omega^2 \cdot \varepsilon_0} \cdot \sqrt{\frac{2 \cdot V_{DC} \cdot \alpha^q}{e \cdot T_e}} + \frac{V_{DC} \cdot \alpha^q \cdot M}{4 \cdot e^2 \cdot n_e \cdot T_e}}$$

The bulk impedance may be expressed as $Z_{bulk}$, and thus the total discharge impedance verses $n_e$, $V_{DC}$, $v_{me}$, $\alpha$, $M_{ion}$ and $T_e$ may be expressed as:

$$Z_{bulk} = \left(i \cdot \omega \cdot C_0 + \frac{1}{i \cdot \omega \cdot L_p + R_p}\right)^{-1}$$

$$L_p = \frac{1}{\omega_{pe}^2 \cdot C_0}$$

$$R_p = \frac{v_{me}}{\omega_{pe}^2 \cdot C_0}$$

$$Z_{bulk} = \left(i \cdot \omega \cdot C_0 + \frac{\omega_{pe}^2 \cdot C_0}{i \cdot \omega + v_{me}}\right)^{-1}$$

$$C_0 = \frac{\varepsilon_0 \cdot \text{Area} \cdot (1 + \alpha)}{L - s_0 \cdot \left(1 + \frac{1}{\frac{q}{\alpha^2}}\right)}$$

$$s = \sqrt[4]{\frac{32 \cdot \varepsilon_0^2 \cdot V_{DC}^3}{81 \cdot .372 \cdot n_e^2 \cdot e \cdot T_e}}$$

$$C_0 = \frac{\varepsilon_0 \cdot \text{Area} \cdot (1 + \alpha)}{L - \sqrt[4]{\frac{32 \cdot \varepsilon_0^2 \cdot V_{DC}^3}{81 \cdot .372 \cdot n_e^2 \cdot e \cdot T_e}} \cdot \left(1 + \frac{1}{\frac{q}{\alpha^2}}\right)}$$

where $n_e$, $V_{DC}$, $v_{me}$, $\alpha$, $M_{ion}$ and $T_e$ respectively are electron density, sheath voltage, collision frequency, discharge asymmetry, ion mass and electron temperature.

Therefore, by measuring the impedance of the equivalent circuit at frequencies 1, 2, ... n and relating the circuit elements $C_{shGND}$, $R_{shGND}$, $C_0$, $R_p$, $L_p$, $C_{shRF}$, and $R_{shRF}$ to plasma parameters $n_e$, $V_{DC}$, $v_{me}$, $\alpha$, $m_{ion}$, and $T_e$ using the equations above, the plasma parameters can be directly determined from impedance measurement.

The plasma characteristics determined at step 210 may be utilized to determine the energy of the effective ions mass generated by the plasma as calculated in accordance with the simulated voltage and current magnitudes obtained by the simulated models. Plasma characteristics, for example ion mass determined at step 210, may also be utilized to resolve the distribution of ions and species within a plasma. As the dissociation of the gas mixture in the processing chamber may be ionized with different forms, such as atomic radicals (Cl·), atomic ions (Cl$^+$), molecular ions (Cl$_2^+$) and excited molecular (Cl$_2^*$), an accurate determination of the distribution of the ions species within the plasma may be utilized to more effectively control plasma processing. The distribution of species may be resolved for either atomic and/or molecular distributions. For example, atomic radicals (Cl·) and/or atomic ions (Cl$^+$) may be recombined and formed as molecular ions (Cl$_2^+$) instead of reacting with the material (e.g., SiO$_2$ or metal) on the substrate, thereby adversely influencing the process performance as desired and alternating the ions distributed in the process region. By knowing the ion mass and resolving the ion distribution for a particular set of process parameters, process performance may more accurately be estimated without lengthy process characterization. As such, the estimation of the effective ion energy and/or distribution may be calculated by the voltage and current magnitudes of RF waveforms coupled to the plasma, thereby identifying the actual reactive species remained and generated in the process chamber. As such, the invention is particularly useful for determining the molecular and atom distributions of diatomic gases (for example, Cl$_2$, O$_2$ and N$_2$, among others) within the plasma. The invention is also useful for determining the distributions of compound fragments within the plasma, such as the distribution of CF$_4$ process gas fragments (CF$^{+3}$, CF$_2^{+2}$, etc). Thus, the process will allow immediate identification of process drift or variations between items, such as process kit variation, chamber to chamber variation and even variation in the composition of gas sources (of a process gas).

Thus, the present application provides methods determining plasma characteristics using a frequency dependant, plasma model. By analyzing the model at different frequencies, the model facilitates determination of plasma characteristics such as ion mass, the distribution of ion mass species, ions density, plasma asymmetry, electron temperature, sheath potential and collision frequency. As a result, the methods advantageously facilitate enhanced process control, management and repeatability of plasma processes.

While the foregoing is directed to embodiments of the present invention, other and further embodiments of the invention may be devised without departing from the basic scope thereof, and the scope thereof is determined by the claims that follow.

What is claimed is:

1. A method for determining characteristics of a plasma, comprising:
    providing a plasma impedance model of a plasma as a function of frequency;
    measuring a metric of a plasma harmonic waveform from the plasma;
    storing the measured harmonic waveform information in a storage device;
    determining at least one characteristic of a plasma using model;
    adjusting processing parameters based on the at least one characteristic of the plasma to obtain a predetermined plasma characteristic; and
    processing a substrate in the presence of a plasma having the predetermined plasma characteristic.

2. The method of claim 1, wherein the step of determining further comprises:
    obtaining current and voltage information of RF waveforms having different frequencies that are coupled to the plasma.

3. The method of claim 2, wherein the step of obtaining further comprises:
    measuring metrics of waveforms provided by a plurality of RF power sources utilized to sustain the plasma.

4. The method of claim 1, wherein the step of determining further comprises:
    determining at least one of an ion mass of the plasma, a distribution of ion mass species within the plasma, an asymmetry of the plasma, an electron temperature of the plasma or an electron-molecule collision frequency within the plasma.

5. The method of claim 1, wherein the step of determining further comprises:

determining a distribution between chlorine (Cl) species within the plasma.

6. The method of claim 1, wherein the step of determining further comprises:

monitoring the at least one characteristic for drift.

7. The method of claim 1, wherein the step of determining further comprises:

monitoring the ion mass for drift during processing.

8. A method for determining characteristics of a plasma, comprising:

providing a plasma impedance model of a plasma as a function of frequency;

measuring current and voltage for waveforms coupled to the plasma and having at least two different frequencies;

measuring a metric of waveform provided by a low power diagnostic source that does not significantly change an operational characteristic of the plasma;

storing the measured current and voltage information in a storage device; and determining ion mass of a plasma from model and the measured current and voltage of the waveforms.

9. The method of claim 8, wherein the step of determining further comprises:

determining an electron-molecule collision frequency within the plasma from model and the measured current and voltage of the waveforms.

10. The method of claim 8, wherein the step of measuring further comprises:

measuring metrics of waveforms provided by a plurality of RF power sources utilized to sustain the plasma.

11. The method of claim 8, wherein the step of determining further comprises:

determining a distribution between diatomic species within the plasma.

12. The method of claim 8, wherein the step of determining further comprises:

determining a distribution between process gas fragments within the plasma.

13. The method of claim 8 further comprising:

adjusting processing parameters based on the determined ion mass to obtain a target ion mass; and processing a substrate in the presence of a plasma having the target ion mass.

* * * * *